(12) United States Patent
Schmidt

(10) Patent No.: US 9,166,537 B2
(45) Date of Patent: Oct. 20, 2015

(54) AMPLIFIER ARRANGEMENT

(71) Applicant: Ubidyne, Inc., Wilmington, DE (US)

(72) Inventor: Lothar Schmidt, Erbach (DE)

(73) Assignee: KATHREIN-WERKE KG, Rosenheim (DE)

( * ) Notice: Subject to any disclaimer, the term of this patent is extended or adjusted under 35 U.S.C. 154(b) by 0 days.

(21) Appl. No.: 13/887,648

(22) Filed: May 6, 2013

(65) Prior Publication Data

US 2013/0314162 A1 Nov. 28, 2013

Related U.S. Application Data

(63) Continuation of application No. 13/185,025, filed on Jul. 18, 2011, now abandoned.

(51) Int. Cl.
| | | |
|---|---|---|
| H03F 3/195 | (2006.01) | |
| H03F 1/02 | (2006.01) | |
| H03F 3/217 | (2006.01) | |
| H03F 3/60 | (2006.01) | |
| H03F 3/72 | (2006.01) | |

(52) U.S. Cl.
CPC .............. *H03F 3/195* (2013.01); *H03F 1/0277* (2013.01); *H03F 1/0288* (2013.01); *H03F 3/2175* (2013.01); *H03F 3/602* (2013.01); *H03F 3/72* (2013.01); *Y10T 29/49117* (2015.01)

(58) Field of Classification Search
CPC ........... H03F 3/68; H03F 1/0288; H03F 1/07; H03F 1/3252
USPC ................. 330/295, 124 R, 84, 126
See application file for complete search history.

(56) References Cited

U.S. PATENT DOCUMENTS

| | | | |
|---|---|---|---|
| 5,793,253 A | 8/1998 | Kumar et al. | |
| 5,994,965 A | 11/1999 | Davis et al. | |
| 6,853,244 B2* | 2/2005 | Robinson et al. | 330/51 |
| 6,982,593 B2* | 1/2006 | Robinson et al. | 330/10 |
| 6,998,914 B2* | 2/2006 | Robinson | 330/124 R |
| 7,091,774 B1 | 8/2006 | Smiley | |
| 7,394,311 B2 | 7/2008 | Jeckeln et al. | |
| 7,411,450 B2 | 8/2008 | Albrecht | |
| 7,474,156 B2 | 1/2009 | Fujii | |
| 7,511,575 B2 | 3/2009 | Gotou et al. | |
| 7,649,411 B2* | 1/2010 | Aoki et al. | 330/51 |
| 7,777,571 B2 | 8/2010 | Gotou et al. | |

(Continued)

FOREIGN PATENT DOCUMENTS

EP 1187314 3/2002

OTHER PUBLICATIONS

Colantonio et al, "High Efficiency RF and Microwave Solid State Power Amplifiers", 2009, pp. 412-415.

(Continued)

*Primary Examiner* — Henry Choe
(74) *Attorney, Agent, or Firm* — Stephen H. Eland; Dann, Dorfman, Herrell & Skillman

(57) ABSTRACT

An amplifier arrangement for amplifying a radio signal comprising at least a first amplifier module and a second amplifier module is presented wherein a splitter stage for dividing an amplifier stage input signal into several signal portions. The signal portions are amplified in the at least two parallel amplifier modules. A combiner stage combines the separate amplifier output signals into a single amplifier arrangement output signal.

5 Claims, 6 Drawing Sheets

(56) References Cited

U.S. PATENT DOCUMENTS

| | | | |
|---|---|---|---|
| 7,855,599 B2 * | 12/2010 | Yamanouchi | 330/136 |
| 7,889,009 B2 | 2/2011 | Jen et al. | |
| 8,013,673 B2 * | 9/2011 | Makioka et al. | 330/126 |
| 8,018,276 B2 | 9/2011 | Ibrahim et al. | |
| 8,064,555 B1 | 11/2011 | Rockway et al. | |
| 8,421,539 B2 * | 4/2013 | Zhang et al. | 330/295 |
| 8,508,299 B2 * | 8/2013 | Kawano et al. | 330/295 |
| 8,509,713 B2 * | 8/2013 | Kenington | 455/126 |
| 8,610,503 B2 * | 12/2013 | Kaczman et al. | 330/295 |
| 2002/0084852 A1 | 7/2002 | Cook et al. | |
| 2004/0239429 A1 | 12/2004 | Kermalli | |
| 2005/0110594 A1 | 5/2005 | Culliton et al. | |
| 2008/0074735 A1 | 3/2008 | Bakalski et al. | |
| 2014/0159991 A1 * | 6/2014 | Kiss et al. | 343/904 |

OTHER PUBLICATIONS

Invitation to Pay Additional Fees issued in International Patent Application No. PCT/EP12/64005 on Oct. 16, 2012.

International Preliminary Report issued in PCT/EP12/64005 on Jan. 21, 2014.

* cited by examiner

AMPLIFIER ARRANGEMENT

CROSS-REFERENCE TO RELATED APPLICATION

This application is a continuation application of U.S. patent application Ser. No. 13/185,025, filed Jul. 18, 2011. The entire disclosure of the foregoing application is hereby incorporated herein by reference.

FIELD OF THE INVENTION

The field of the present application relates in general to an amplifier arrangement and in particular to a radio station with an amplifier arrangement. The field of the application also relates to a method of manufacturing an amplifier arrangement. The field of the application further relates to a chipset of an amplifier arrangement.

BACKGROUND OF THE INVENTION

It is general knowledge to use balanced amplifiers in radio stations for amplifying a transmitter signal in order to improve efficiency. A balanced amplifier comprises a first amplifying device and a second amplifying device that are operated in parallel. A quadrature splitter at an input of the balanced amplifier phase shifts an input signal of the balanced amplifier to a first signal portion and a second signal portion which are 90 degrees apart in phase. The first signal portion is amplified by the first amplifier device and the second signal portion is amplified by the second amplifier device. The first amplified signal portion and the second amplified signal portion are re-combined in a quadrature coupler which shifts the phases of the first amplified signal portion and the second amplified signal portion such that the first amplified signal portion and the second amplified signal portion are combined in phase. Such balanced amplifiers are more immune to load pull effects than in-phase power combining schemes, because any reflected signals are 180 degrees apart in phase and thus substantially cancel each other when combined.

The use of mobile communications networks has increased over the last decade. Operators of the mobile communications networks have increased the number of base stations in order to meet an increased demand for service by users of the mobile communications network. The operators of the mobile communications network wish to purchase components for the base stations at a lower price and also wish to reduce the running costs of the base station. Since power amplifiers consume more than 50% of the total power of a transmitter system improvements in the efficiency of the power amplifier technology are the most promising contributors to more efficient base transceiver stations and/or active antenna arrays.

SUMMARY OF THE INVENTION

It is an aspect of the teachings of the present disclosure to provide an amplifier arrangement for amplifying a radio signal comprising a splitter stage for splitting an input signal into at least a first signal portion, and at least a second signal portion. The amplifier arrangement further comprises at least a first amplifier module for amplifying the first signal portion. The first amplifier module comprises a first amplifier and a second amplifier. The amplifier arrangement further comprises at least one second amplifier module for amplifying the at least second signal portion. The second amplifier module comprises a third amplifier and a fourth amplifier. The amplifier arrangement further comprises a combiner stage for combining the first amplified signal, received at a first combiner stage input, and the second amplified signal, received at a second signal combiner input, into an amplified stage output signal.

In such an amplifier arrangement the amplification of the input signal is thus distributed over at least four parallel amplifier devices. In the event that the amplification is distributed over a plurality of n amplifier devices, the supply voltage of each amplifier can be reduced substantially to the square root of the number of amplifier devices in parallel with each other, in comparison to a single amplifier device for generating the same output power level. For example four parallel amplifiers can be operated at half of the supply voltage to achieve a comparable output power. The reduced voltage of the power supply also reduces the break down voltage that transistors in the amplifier devices have to withstand and thus enables cheaper technologies, such as silicon based technologies, to integrate these amplifiers in an integrated circuit.

In another aspect of the present disclosure the first amplifier module and the second amplifier module are one of balanced amplifiers or Doherty amplifiers. Such balanced amplifiers enable optimal input reflection and output reflection coefficients and a low sensitivity to load impedance variations as discussed earlier. By using the balanced amplifiers in parallel these properties can be improved further.

In another aspect of the teachings of the present disclosure, the first amplifier module comprises a first sigma-delta modulator for processing a first amplifier module input signal and the at least first amplifier module further comprising a first delta-sigma modulator driven amplifier. The second amplifier module comprises a second sigma-delta modulator for processing a second amplifier module input signal and the at least second amplifier module further comprising a second delta-sigma modulator driven amplifier.

Sigma-delta modulators are widely used in signal processing. In addition to the wanted signal the sigma-delta modulators generate background noise due to the switching nature and thus have a limited signal to noise ratio. Combining a plurality of amplified independent sigma-delta modulated signals improves the signal to noise ratio, because the wanted signal from each of the sigma-delta modulated signals add constructively, while the noise increases only by a factor of root mean square. Doubling the number of combined independently delta-sigma modulated signals improves the signal to noise ratio by 3 dB.

Another aspect of the present disclosure is that the amplifier arrangement further comprises a power distributor for switching on and off a power supply for at least the second amplifier. The switching is governed by the output power of the amplifier arrangement.

By selectively switching off particular amplifiers only the amount of amplifiers are supplied with a supply power that is needed to achieve a certain power level. As switched off amplifiers do not use supply power, the power efficiency is improved.

Another aspect of the present disclosure is that an output of the first amplifier is connected to a first filter, an output of the second amplifier is connected to a second filter, an output of the third amplifier is connected to a third filter and an output of the fourth amplifier is connected to a fourth filter.

Instead of using a single filter, e.g. at the output of the amplifier arrangement, each amplifier device output is connected to an individual filter. Since the individual filter can be designed for reduced power durability, filters of different type can be chosen than for a single filter that would have to bear the full output power.

Another aspect of present disclosure is that at least one of the first filter, or the second filter, or the third filter, or the fourth filter is a film bulk acoustic resonator filter (FBAR).

This kind of filters are available for relatively small output power durability and therefore could not be used in power amplifiers providing an output power that is higher than the power durability of the available FBAR. With the concept of the present disclosure each FBAR is charged only with the output power of each individual amplifier device. The use of a plurality of parallel FBAR filter reduces the volume of the amplifier arrangement and also the costs of the amplifier arrangement.

In another aspect of the amplifier arrangement the film bulk acoustic resonator filter (FBAR) is a duplex filter with a first port for passing a first signal in a first frequency band to an antenna port of the FBAR filter and a second port for receiving a second signal in a second frequency band from the antenna port. The second port of the duplex FBAR filter is connected via an impedance to a reference level. With an arrangement like this the filter properties for out-of band noise signal suppression can be improved.

Another aspect of the present disclosure is a chipset comprising an amplifier arrangement for amplifying a radio signal comprising a splitter stage for splitting an amplifier input signal into at least a first signal portion, and at least a second signal portion. The chipset further comprises at least a first amplifier module for amplifying the at least first signal portion, the at least first amplifier module comprising a first amplifier and a second amplifier. The chipset further comprises at least a second amplifier module for amplifying the at least second signal portion, the second amplifier module comprising a third amplifier and a fourth amplifier. The chipset further comprises a combiner stage for combining the first amplified signal, received at a first combiner stage input, and the second amplified signal, received at a second signal combiner input, into a amplified stage output signal.

Another aspect of the present disclosure is a method of amplifying a radio signal comprising splitting an amplifier input signal into at least a first signal portion, and at least a second signal portion. The method further comprises amplifying the at least first signal portion by a first amplifier module, the first amplifier module comprising a first amplifier and a second amplifier. The method further comprises amplifying the second signal portion by a second amplifier module, the second amplifier module comprising a third amplifier and a fourth amplifier. The method further comprises combining the first amplified signal and the second amplified signal into an amplified stage output signal.

Another aspect of present disclosure is a method of manufacturing an amplifier arrangement for amplifying a radio signal comprising connecting a first splitter stage output of a splitter stage to a first amplifier module input of a first amplifier module, the first amplifier module comprising a first amplifier and a second amplifier. The method further comprises connecting a second splitter stage output of a splitter stage to a second amplifier module input of a second amplifier module, the second amplifier module comprising a third amplifier and a fourth amplifier. The method further comprises connecting a first amplifier module output of the first amplifier module to a first combiner stage input of a combiner stage. The method comprises connecting a second amplifier module output of the second amplifier module to a second signal combiner input of the combiner stage.

Another aspect of the teaching of this disclosure is a computer program product comprising a non-transitory computer-usable medium having control logic stored therein for causing a computer to manufacture a amplifier arrangement for amplifying a radio signal comprising connecting a first splitter stage output of a splitter stage to a first amplifier module input of a first amplifier module, the first amplifier module comprising a first amplifier and a second amplifier. The method further comprises connecting a second splitter stage output of a splitter stage to a second amplifier module input of a second amplifier module, the second amplifier module comprising a third amplifier and a fourth amplifier. The method further comprises connecting a first amplifier module output of the first amplifier module to a first combiner stage input of a combiner stage. The method comprises connecting a second amplifier module output of the second amplifier module to a second signal combiner input of the combiner stage.

DETAILED DESCRIPTION OF THE INVENTION

The invention will now be described on the basis of the drawings. It will be understood that the embodiments and aspects of the invention described herein are only examples and do not limit the protective scope of the claims in any way.

The invention is defined by the claims and their equivalents. It will be understood that features of one aspect or embodiment of the invention can be combined with a feature of a different aspect or aspects and/or embodiments of the invention.

Figure 1:
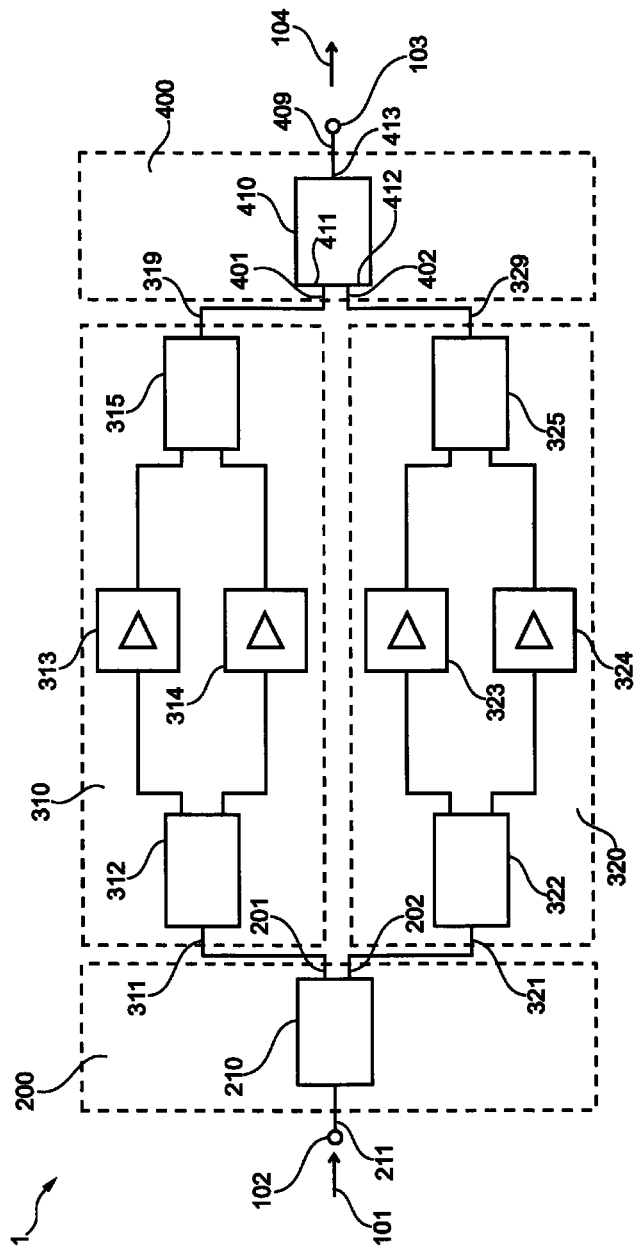
FIG. 1 shows a first aspect of the amplifier arrangement according to the present disclosure

FIG. 1 shows a first aspect of an amplifier arrangement 1 according to the present disclosure for amplifying an amplifier arrangement input signal 101 received at an amplifier arrangement input 102 and providing an amplifier arrangement output signal 104 at an amplifier arrangement output 103. The amplifier arrangement input signal 101 may be, but is not limited, to a radio transmit signal. It will be understood that a plurality of transmit signals use adjacent frequencies and thus form a transmit frequency band. The term amplifier arrangement input signal 101 within this disclosure therefore also should be understood to comprise transmit signals of a transmit frequency band.

The amplifier arrangement 1 comprises a splitter stage 200, a first amplifier module 310, a second amplifier module 320, and a combiner stage 400. In this aspect of the present disclosure the splitter stage 200 splits the first amplifier arrangement input signal 101 at a signal splitter input 211 into a first amplifier module input signal at a first splitter output 201 and a second amplifier module input signal at a second splitter output 202.

The first amplifier module input signal is passed to the first amplifier module input 311 and the second amplifier module input signal is passed to a second amplifier module input 321. The first amplifier module 310 and the second amplifier module 320 are in this aspect of the present disclosure balanced amplifiers and will be discussed in detail below. The first amplifier module 310 amplifies the first amplifier module input signal received at the first amplifier module input 311 and provides a first amplified amplifier module output signal at a first amplifier module output 319. The second amplifier module 320 amplifies the second amplifier module input signal received at the second amplifier module input 321 and provides a second amplified amplifier module output signal at a second amplifier module output 329.

In the combiner stage 400 the first amplifier module output signal, received at a first filter combiner stage input 401, and the second amplifier module output signal, received at a second filter combiner stage input 402, are combined into a combiner stage output signal, which is provided at a combiner stage output 409. In this aspect of the disclosure the first combiner stage output coincides with the first amplifier arrangement output 103.

In this aspect of the present disclosure the signal splitter stage 200 comprises only a first signal splitter 210. In this aspect of the present disclosure the first signal splitter 210 is a bidirectional coupler, such as a so-called Wilkinson combiner or a so-called quadrature hybrid. Both, the Wilkinson coupler and the quadrature hybrid split an input signal into two output signals of equal power. However, the first output signal and the second output signal of a Wilkinson coupler are in-phase whereas the first output signal and the second output signal of a quadrature hybrid are 90° apart in phase. The person skilled in the art will appreciate that the Wilkinson coupler and the quadrature coupler are mere examples of a suitable signal splitter 210, but do not limit the present disclosure to these elements.

In this aspect of the present disclosure the signal combiner stage 400 comprises a single first signal combiner 410. A first signal combiner input 411 of the first signal combiner 410 is connected to the first signal combine stage input 401. A second signal combiner input 412 of the first signal combiner 410 is connected to the second signal combiner stage input 402. A first signal combiner output 413 of the first signal combiner 410 is connected to the first signal combine stage output 409. In this aspect of the present disclosure the first signal combiner 410 is a bidirectional coupler, such as a so-called Wilkinson combiner or a so-called quadrature hybrid. If the first signal splitter 210 and the first signal combiner 410 are both quadrature hybrids, the first input signal of the first signal combiner 410 and the second input signal of the first signal combiner 410 have to be chosen such that the phase difference between the first signal splitter output signal and the second signal splitter output signal is compensated. The person skilled in the art will appreciate that the Wilkinson coupler and the quadrature hybrid are just examples of a suitable signal combiner 410 but do not limit the present disclosure to these elements.

In the first aspect of the present disclosure the first amplifier module 310 and the second amplifier module 320 are balanced amplifiers with identical structure. For reasons of brevity only the structure of the first amplifier module is now explained in more detail.

The first amplifier module input signal, received at a first amplifier module input 311 is passed to a first module signal splitter 312. In this aspect of the present disclosure the first module signal splitter is a quadrature hybrid, which splits the first module input signal into a first module signal portion and a second module signal portion of substantially equal power. The first module signal portion and the second module signal portion are 90° apart in phase. The first module signal portion is amplified by a first amplifier device 313 to a first amplified portion signal and the second module signal portion is amplified by a second amplifier device 314 to a second amplified portion signal. The first amplified portion signal and the second amplified portion signal are re-combined in phase by a module signal combiner 315 providing a first amplifier output signal at a first amplifier module output 319. The first module signal splitter 312 and the second module signal combiner 315 ensure optimal input reflection and output reflection coefficients and a low sensitivity to load impedance variations.

By providing a first balanced amplifier module and a second amplifier module in parallel an input reflection coefficient of the amplifier arrangement 1 and a output reflection coefficient of the amplifier arrangement 1 are even less sensitive to load impedance variation than a single balanced amplifier module. All amplifier devices can be implemented in a single integrated circuit. If four amplifier modules are used in the amplifier arrangement 1 the supply voltage can be reduced to only half the supply voltage of a single amplifier device with a comparable output power of the amplifier output signal. The breakdown voltage of transistors used in the amplifier devices is reduced in comparison to a single amplifier, which allows using less expensive processes for the manufacturing of the integrated circuit, such as silicon based technologies.

In another aspect of the present disclosure the first amplifier module and the second amplifier module are Doherty amplifiers. The Doherty amplifier is a special type of amplifier where the first amplifier module is operated in class A mode or in class AB mode and the second amplifier device is operated in class C mode which leads to an improved efficiency.

Figure 2:
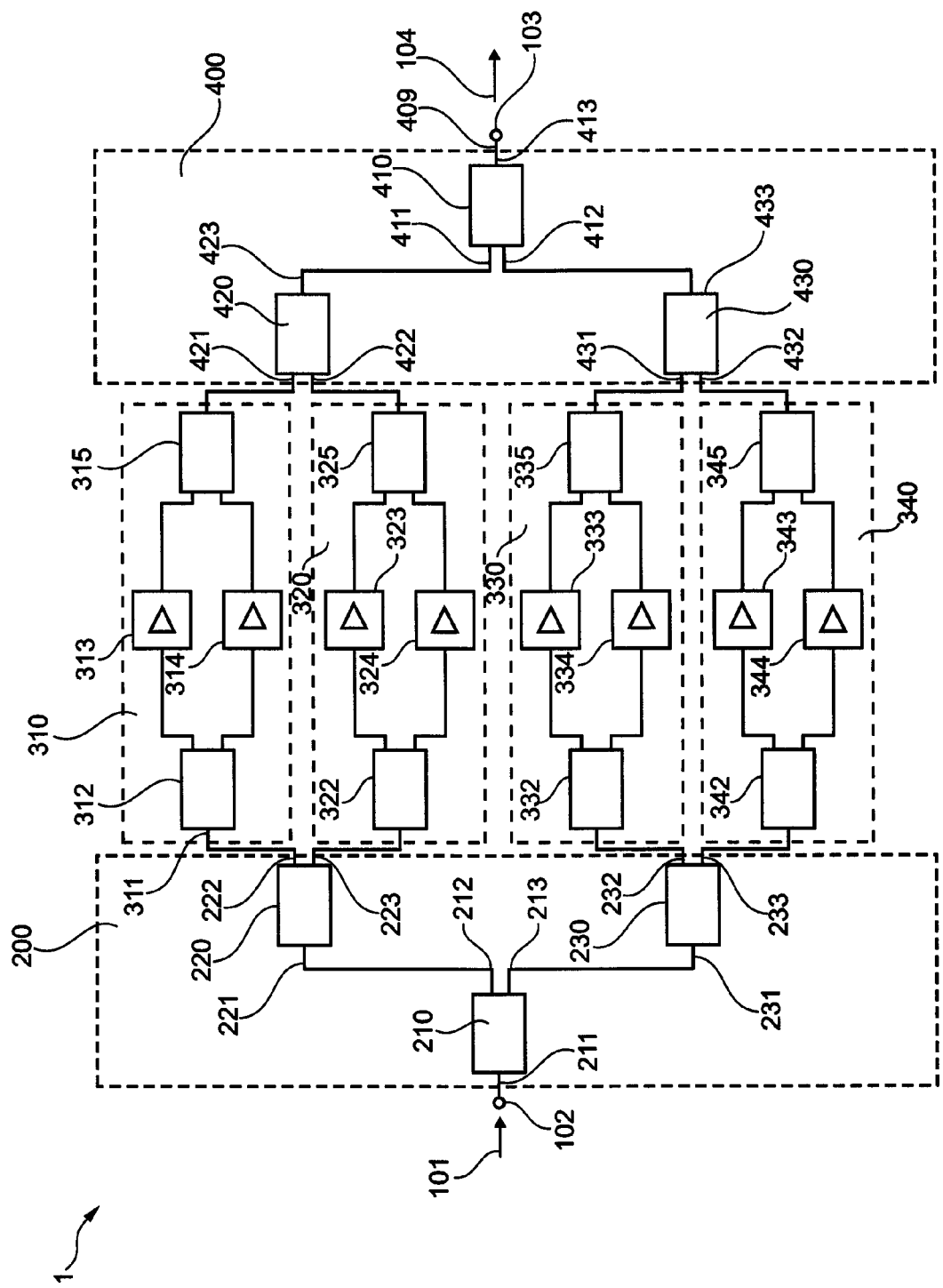
FIG. 2 shows a further aspect of the amplifier arrangement according to the present disclosure

FIG. 2 shows another aspect of the present disclosure in which the amplifier arrangement 1 comprises the signal splitter stage 200 for providing a first signal splitter portion signal, a second signal splitter portion signal, a third signal splitter portion signal and a fourth signal splitter portion signal. The first signal splitter portion signal is passed to a first amplifier module 310 for providing a first amplified portion signal. The second signal splitter portion signal is passed to a second amplifier module 320 for providing a second amplified portion signal. The third signal splitter portion signal is passed to a third amplifier module 330 for providing a third amplified portion signal. The fourth signal splitter portion signal is passed to a fourth amplifier module 340 for providing a fourth amplified portion signal. The first amplified portion signal and the second amplified portion signal and the third amplified portion signal and the fourth amplified portion signal are re-combined in a combiner stage 400.

In this aspect of the present disclosure the splitter stage 200 is formed by a first signal splitter 210, a second signal splitter 220 and a third signal splitter 230. The first signal splitter 210 splits a first signal splitter input signal, received at a first signal splitter input 211 into a first portion and a second portion of the first signal splitter input signal. The first portion of the first signal splitter input signal is provided at a first signal splitter output 212 and the second portion of the second signal splitter input signal is provided at a second signal splitter output 213. The first signal splitter output 212 is connected to a second signal splitter input 221 of the second signal splitter 220 and the second signal splitter output 213 is connected to a third signal splitter input 231 of the third signal splitter 230. The second signal splitter 220 splits a second signal splitter input signal, received at the second signal splitter input 221, into a third portion and a fourth portion of the second signal splitter input signal. The third portion of the second signal splitter input signal is provided at a third signal splitter output 222. The fourth portion of the second signal splitter input signal is provided at a fourth signal splitter output 223. The third signal splitter 230 splits a third signal splitter input signal, received at the third signal splitter input 231 into a fifth portion and a sixth portion of the third signal splitter input signal. The fifth portion of the second signal splitter input signal is provided at a fifth signal splitter output 232. The sixth portion of the third signal splitter input signal is provided at a sixth signal splitter output 233.

The combiner stage 400 comprises a first signal combiner 410, a second signal combiner 420 and a third signal combiner 430. The second signal combiner 420 combines a third input signal and a fourth input signal received at a third signal combiner input 421 and a fourth signal combiner input 422 into a second signal combiner output signal, which is provided at a second signal combiner output 423. The third signal combiner 430 combines a fifth input signal and a sixth input signal received at a fifth signal combiner input 431 and a sixth signal combiner input 432 into a third single signal combiner output signal which is provided at a third signal combiner output 433. The second signal combiner output 423 is connected to a first signal combiner input 411 of the first signal combiner 410, and the third signal combiner output 433 is connected to a second signal combiner input 412 of the first signal combiner 410. The first signal combiner 410 combines the first input signal and the second input signal received at the first signal combiner input 411 and the second signal combiner input 412 into a first single signal combiner output signal which is provided at a first signal combiner output 413. The first single signal combiner output 413 signal forms in this aspect of the present disclosure the output signal of the combiner stage 400 at 409 and thereby also forms the amplifier arrangement output signal 104.

With this arrangement four balanced amplifiers modules can be operated in parallel. This means that for a desired output power the supply voltage can be reduced by a factor that is the square root of four (i.e. two), in comparison to the use of a single balanced amplifier.

The person skilled in the art will readily appreciate that by adding additional signal splitters and cascading them in the same manner as in the second aspect of this disclosure described, the number of outputs of the splitter stage can be extended in a fan-out like form to any required number of parallel output signals. This is also applicable to the combiner stage 400, wherein any required number of input signals can be combined by adding an appropriate number of additional signal combiners and connecting them in a fan-in like form. In this aspect of the present disclosure, where each signal splitter splits an input signal into two signal portions, each signal splitter may be chosen to split a signal splitter input signal into a number of signal portions greater than two. Combining different signal splitters with different number of divided output signals any arbitrary required number of splitter stage output signals can be generated.

Figure 3:
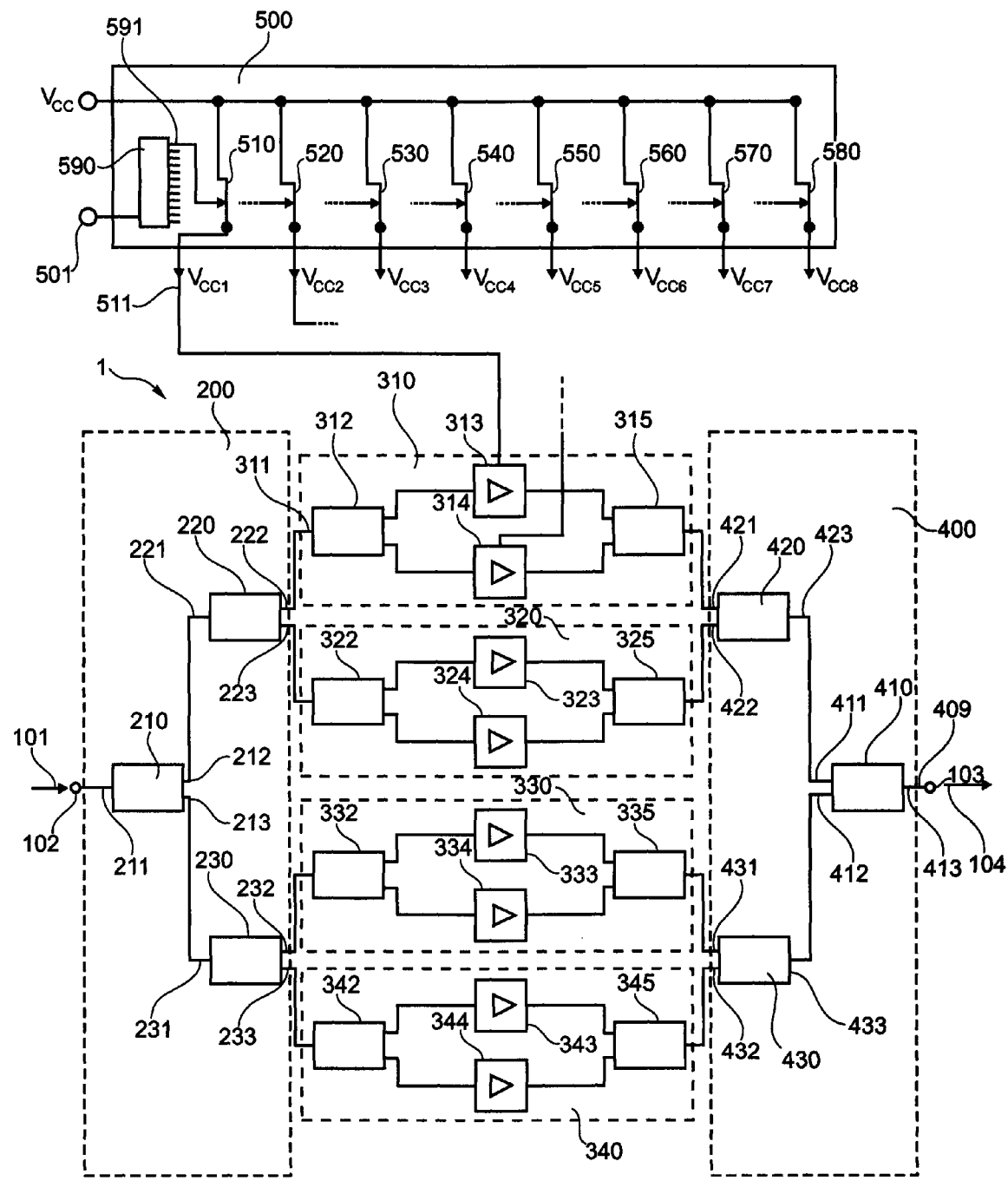
FIG. 3 shows yet another aspect of the amplifier arrangement according to the present disclosure

FIG. 3 shows another aspect of the present disclosure where the amplifier arrangement comprises a power distributor 500 for switching on and off a power supply separately for each one of the amplifier devices (the first amplifier device 313, the second amplifier device 314, the third amplifier device 323, the fourth amplifier device 324, the fifth amplifier device 333, the sixth amplifier device 334, the seventh amplifier device 343, and the eighth amplifier device 344). The switching is governed by the output power of the amplifier arrangement 1.

The amplifier arrangement 1 is, apart from the power distributor 500, identical to the amplifier arrangement 1 presented in FIG. 2. The power distributor 500 is connected to a supply voltage $V_{CC}$ and distributes the supply voltage $V_{CC}$ as a first amplifier supply voltage $V_{CC1}$ to the first amplifier device 313, as a second amplifier supply voltage $V_{CC2}$ to the second amplifier device 314, as a third amplifier supply voltage $V_{CC3}$ to the third amplifier device 323, as a fourth amplifier supply voltage $V_{CC4}$ to the fourth amplifier device 324, as a fifth amplifier supply voltage $V_{CC5}$ to the fifth amplifier device 333, as a sixth amplifier supply voltage $V_{CC6}$ to the sixth amplifier device 334, as a seventh amplifier supply voltage $V_{CC7}$ to the seventh amplifier device 343, and as an eighth amplifier supply voltage $V_{CC1}$ to the eighth amplifier device 344. Substantially the power distributor 500 comprises a first controllable switch 510 for interrupting the first power amplifier supply voltage $V_{CC1}$, a second controllable switch 520 for interrupting the second power amplifier supply voltage $V_{CC2}$, a third controllable switch 530 for interrupting the third power amplifier supply voltage $V_{CC3}$, a fourth controllable switch 540 for interrupting the fourth power amplifier supply voltage $V_{CC4}$, a fifth controllable switch 550 for interrupting the fifth power amplifier supply voltage $V_{CC5}$, a sixth controllable switch 560 for interrupting the sixth power amplifier supply voltage $V_{CC6}$, a seventh controllable switch 570 for interrupting the seventh power amplifier supply voltage $V_{CC7}$, and a eighth controllable switch 580 for interrupting the eighth power amplifier supply voltage $V_{CC8}$. For reasons of clarity only the first power supply line 511 supplying the first amplifier device 313 with the first supply voltage $V_{CC1}$ is shown in FIG. 3.

The power distributor 500 further comprises a power control input 501 for receiving power control data representing the desired power output level of the amplifier arrangement 1. In dependence of the power control data a switching logic 590 decides how many of the first amplifier device 313, the second amplifier device 314, the third amplifier device 323, the fourth amplifier device 324, the fifth amplifier device 333, the sixth amplifier device 334, the seventh amplifier device 343 and the eighth amplifier device 344 can be switched on or off. For reasons of clarity only a first control line 591 that switches the first controllable switch 510 on and off is shown in FIG. 3.

Since the amplifiers have a range of amplifier gain, at which the amplifiers work most efficiently, the power distributor 500 exactly selects the number of amplifier devices (the first amplifier device 313, the second amplifier device 314, the third amplifier device 323, the fourth amplifier device 324, the fifth amplifier device 333, the sixth amplifier device 334, the seventh amplifier device 343, and the eighth amplifier device 344) that will provide the desired output power with the minimal overall supply power consumption possible. The amplifier devices that are not needed are switched off and do not consume any power.

Figure 4:
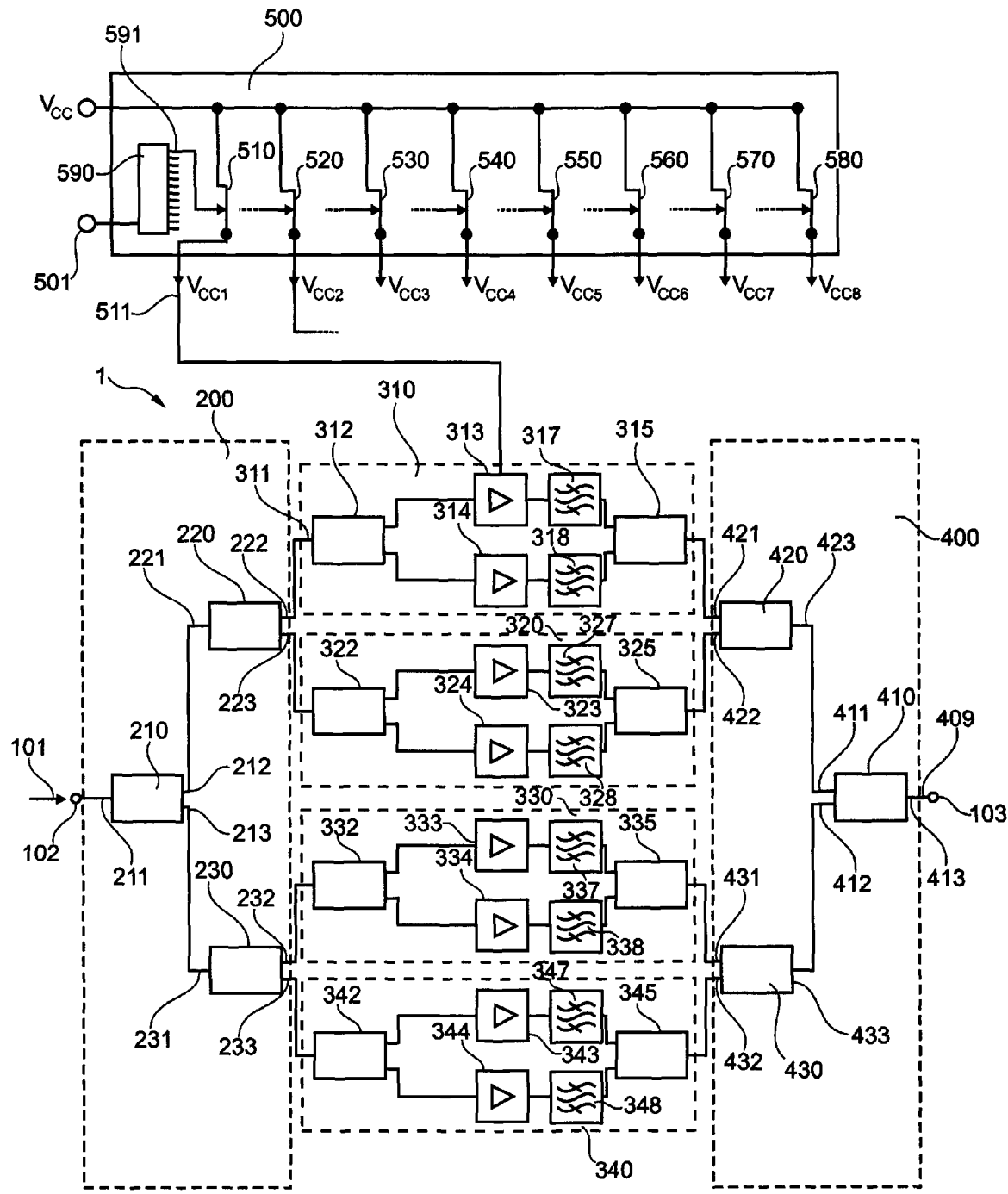
FIG. 4 shows yet another aspect of the amplifier arrangement according to the present disclosure

FIG. 4 shows another aspect of the present disclosure where a first filter element 317 is inserted between a first amplifier device output of the first amplifier device 313 and a first module signal combiner input of a first module signal combiner 315. A second filter element 318 is inserted between a second amplifier device output of a second amplifier device 314 and a second module signal combiner input of the first module signal combiner 315. A third filter element 327 is inserted between a third amplifier device output of a third amplifier device 323 and a third module signal combiner input of a second module signal combiner 325. A fourth filter element 328 is inserted between a fourth amplifier device output of a fourth amplifier device 324 and a fourth module signal combiner input of the second module signal combiner 325. A fifth filter element 337 is inserted between a fifth amplifier device output of a fifth amplifier device 333 and a fifth module signal combiner input of a third module signal combiner 335. A sixth filter element 338 is inserted between a sixth amplifier device output of a sixth amplifier device 334 and a sixth module signal combiner input of the third module signal combiner 335. A seventh filter element 347 is inserted between a seventh amplifier device output of a seventh amplifier device 343 and a seventh module signal combiner input of a fourth module signal combiner 345. An eighth filter element 348 is inserted between an eighth amplifier device output of an eighth amplifier device 344 and an eighth module signal combiner input of the fourth module signal combiner 345. All other elements of the amplifier arrangement shown in FIG. 4 are identical to the amplifier arrangement 1 shown in FIG. 3.

Each of the first filter element 317, the second filter element 318, the third filter element 327, the fourth filter element 328, the fifth filter element 337, the sixth filter element 338, the seventh filter element 347, and the eighth filter element 348 have to bear substantially only one eighth of the power compared to a single filter element that would have to be placed instead at the amplifier arrangement output.

Another aspect of the present disclosure is that this kind of amplifier arrangement enables the use of film bulk acoustic resonator filter (FBAR). Bulk acoustic resonator filters are piezoelectric filters, which are far smaller than other types of filters, like ceramic filters or surface acoustic wave filters (SAW). However, due to their relatively small power durability at the time of the present disclosure their use in transceivers has been limited to transceivers with a maximum output power of +30 dBm. For example a typical miniature PCS/UMTS Band pass filter is available at the time of the present disclosure from AVAGO technologies under the product name ACMD-7005. The data sheet of this band pass filter shows a high power rating of +30 dBm. By using a amplifier arrangement as disclosed in this aspect of the present disclosure this amplifier arrangement can be used in transceivers with an output power of +39 dBm, as each of the parallel doubling arranged filter elements adds an additional power durability of +3 dbm, in this case 8 parallel arranged filters levels to 9 dB. Although to achieve this effect seven signal splitters and seven signal combiners have to be provided, the overall space requirement and the overall costs are similar to a conventional transceiver design with only a single common ceramic filter provided for comparable power durability, but volume and weight are significantly lower.

In another aspect of the present disclosure instead of a band filter a duplex-filter is used for the filter elements (the first filter element 317, the second filter element 318, the third filter element 327, the fourth filter element 328, the fifth filter element 337, the sixth filter element 338, the seventh filter element 347, and the eighth filter element 348). In this aspect of the present disclosure a filter output of this duplex filter is not used, but terminated with a load impedance.

Figure 5:
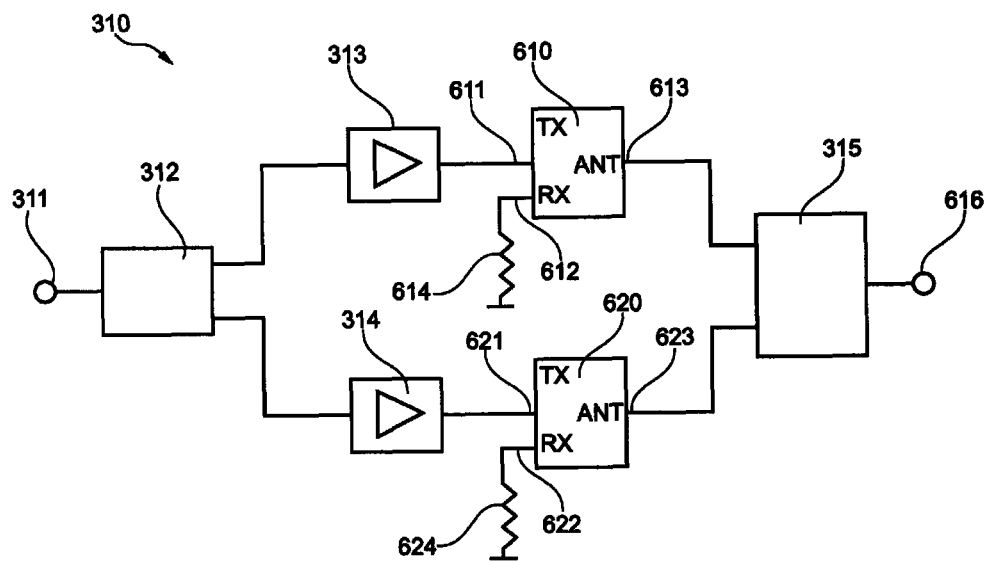
FIG. 5 shows yet another aspect of the amplifier arrangement according to the present disclosure

FIG. 5 shows this use of a first duplex filter 610 and the use of a second duplex filter 620 in a first amplifier module 310. A first amplifier device output of a first amplifier device 313 is connected to a first transmit port 611 of the first duplex filter 610. A first antenna port 613 of the first duplex filter 610 is connected to the first module combiner input of a first module combiner 315. A first receive port 612 of the first duplex filter 610 is connected via a load impedance 614 to a reference level. A second amplifier device output of a second amplifier device 314 is connected to a second transmit port 621 of the second duplex filter 620. A second antenna port 623 of the second duplex filter 620 is connected to a second module combiner input the first module combiner 315. A second receive port 622 of the second duplex filter 620 is connected via a second load impedance 624 to the reference level.

Figure 6:
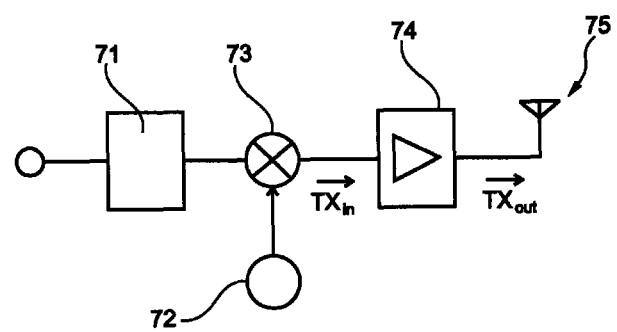
FIG. 6 shows yet another aspect of the amplifier arrangement according to the present disclosure

FIG. 6 shows as another aspect of the present disclosure the use of the amplifier arrangement in a radio station. The radio station may for example be part of an antenna array system for the mobile communications network. This aspect of the present disclosure relates only to the transmitting part of the radio station and thus only the transmitting part is shown. The person skilled in the art will appreciate that the radio station for the mobile communications network will also include circuit arrangements for receiving the radio signal. For reasons of clarity only the most essential components are presented in FIG. 6. In the context of this disclosure the radio station is part but is not limited to a base transceiver station, as known from GSM networks, as well as a node B (known from UMTS/3G networks) or enhanced node B, and similar units used in other mobile communication network.

A base band signal, which comprises encoded data, e.g. encoded voice data, is modulated in an I/Q-modulator 71. The modulated signal is mixed with a radio frequency signal from a synthesized local oscillator 72 in an up-converter 73 and passed to a power amplifier 74 as a transmit input signal $TX_{in}$. The amplified radio signal $TX_{out}$ is passed to an antenna 75. The power amplifier 74 in this aspect of the present disclosure corresponds to the power amplifier arrangement 1 described in the present disclosure.

Figure 7:
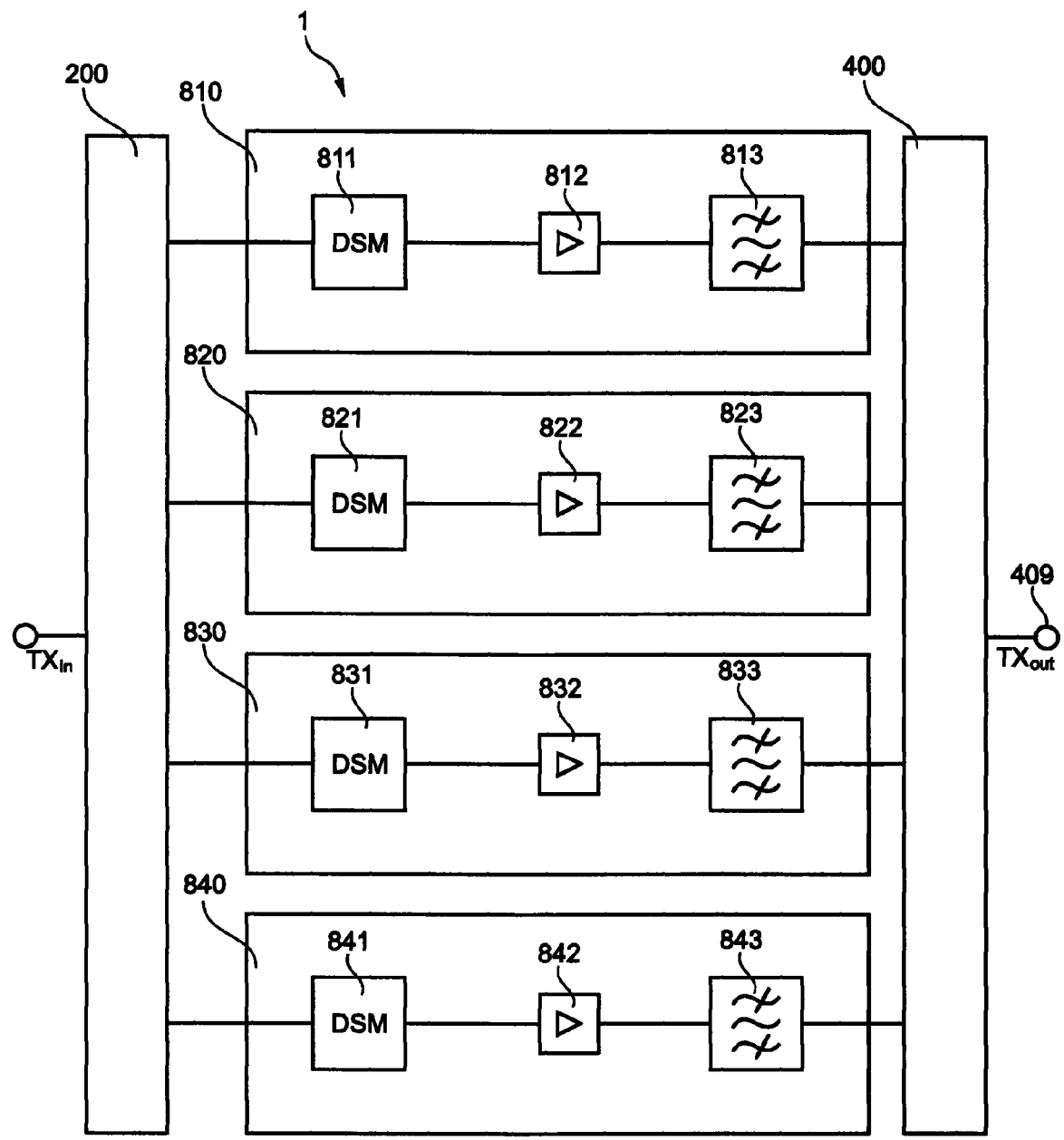
FIG. 7 shows yet another aspect of the amplifier arrangement according to the present disclosure

FIG. 7 shows another aspect of the present disclosure where the input signals of the amplifiers are generated by means of delta-sigma modulators. In FIG. 7 a signal splitter stage 200 splits an input signal into a first signal stage portion signal, a second signal stage portion signal, a third signal stage portion signal and a fourth signal stage portion signal. The first signal stage portion signal is passed to a first input of a first delta-sigma modulator driven amplifier module 810, the second signal stage portion signal is passed to a second input of a second delta-sigma modulator driven amplifier module 820, the third signal stage portion signal is passed to a third input of a third delta-sigma modulator driven amplifier module 830, and the fourth signal stage portion signal is passed to a fourth input of a fourth delta-sigma modulator driven amplifier module 840. A first delta-sigma modulator driven amplifier module output of the first delta-sigma modulator driven amplifier module 810 is connected to the first signal combiner stage input, a second delta-sigma modulator driven amplifier module output of the second delta-sigma modulator driven amplifier module 820 is connected to the a second signal combiner stage input, a third delta-sigma modulator driven amplifier module output of the third delta-sigma modulator driven amplifier module 830 is connected to the a third signal combiner stage input, and a fourth delta-sigma modulator driven amplifier module output of the fourth delta-sigma modulator driven amplifier module 840 is connected to the a fourth signal combiner stage input. The combiner stage 400 combines a first combiner stage input signal received at the first combiner stage input, a second combiner stage input signal received at the second combiner stage input, a third combiner stage input signal received at the third combiner stage input, and a fourth combiner stage input signal received at the fourth combiner stage input to a single combiner stage output signal, provided at the combiner stage output 409. The structure of the signal splitter stage 200 of this aspect of the present disclosure may be chosen identical to the structure of the signal splitter stage describe in FIG. 2 and the structure of the signal combiner stage 400 of this aspect of the present disclosure may be chosen identical to the structure of the signal combiner stage describe in FIG. 2. The person skilled in the art will appreciate that there is a variety of other hardware designs that are suitable for the signal splitter stage 200 and the signal combiner stage 400.

The first delta-sigma modulator driven amplifier module input is connected to a first delta-sigma modulator input of a first delta-sigma modulator 811. A first delta-sigma modulator output is connected to a first amplifier input of a first amplifier 812. A first amplifier output is connected to a first amplifier filter input of a first amplifier filter 813. A first amplifier filter output of the first amplifier filter forms the delta-sigma modulator driven amplifier module output. The second delta-sigma modulator driven amplifier module 820, the third delta-sigma modulator driven amplifier module 830 and the fourth delta-sigma modulator driven amplifier module 840 in this aspect of the present disclosure are identical to the first delta-sigma modulator amplifier module 810.

A transmitter signal, received at the first input of the first delta-sigma modulator driven amplifier module 810, is processed by the first delta-sigma modulator 811 into a first modulated binary signal. The modulated binary signal drives the first amplifier 812 with the wanted signal plus unavoidable out-of-band noise. The first band pass filter 813 at the output smoothes the first amplifier output signal and suppresses out-off band signals.

Operating the four delta-sigma modulator driven amplifier modules (the first delta-sigma modulator driven amplifier module 810, the second delta-sigma modulator driven amplifier module 820, the third delta-sigma modulator driven amplifier module 830, and the fourth delta-sigma modulator driven amplifier module 840) in parallel enables the amplifier arrangement 1 to operate on a lower power supply voltage to achieve comparable signal output power to a single delta-sigma modulator driven amplifier. In addition the parallel delta-sigma modulator driven amplifier modules (the first delta-sigma modulator driven amplifier module 810, the second delta-sigma modulator driven amplifier module 820, the third delta-sigma modulator driven amplifier module 830, and the fourth delta-sigma modulator driven amplifier module 840) achieve a better adjacent channel power ratio as the noise that the four parallel delta-sigma modulators (the first delta-sigma modulator 811, the second delta-sigma modulator 821, the third delta-sigma modulator 831, and the fourth delta-sigma modulator 841), which independently from each other drive the four separate amplifiers (the first amplifier 812, the second amplifier 822, the third amplifier 832, and the fourth amplifier 842), generate is uncorrelated so that the uncorrelated noise signals only add up with their root mean square, while the wanted signals ad up constructively. Thus the power of the combined noise signal is lower compared to the wanted signal than that of a single delta-sigma modulator driven amplifier. The person skilled in the art will readily appreciate that this advantage occurs as well in case the four amplifiers (the first amplifier 812, the second amplifier 822, the third amplifier 832, and the fourth amplifier 842) are analogous amplifiers as well as in the case the four amplifiers (the first amplifier 812, the second amplifier 822, the third amplifier 832, and the fourth amplifier 842) are switching amplifiers (Class S amplifiers).

The present disclosure further relates to a computer program product embedded on a computer readable medium. The computer program product comprises executable instructions for the manufacture of the amplifier arrangement of the present disclosure.

While various embodiments of the present invention have been described above, it should be understood that they have been presented by way of example, and not limitation. It will be apparent to persons skilled in the relevant arts that various changes in form and detail can be made therein without departing from the scope of the invention. Thus, the present invention should not be limited by any of the above-described exemplary embodiments, but should be defined only in accordance with the following claims and their equivalents.

In addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. An amplifier arrangement for amplifying a radio signal in a mobile communication network comprising:
  a splitter stage for splitting an amplifier input radio signal into at least a first signal portion, and at least a second radio signal portion;
  at least a first amplifier module comprising:
    a first delta-sigma modulator for converting the first radio signal portion to a first modulated binary signal; and a first delta-sigma modulator driven amplifier for amplifying the first modulated binary signal;
  at least an independent second amplifier module comprising:
    a second delta-sigma modulator for converting the second radio signal portion to a second modulated binary signal; and a second delta-sigma modulator driven amplifier for amplifying the second modulated binary signal;
  a combiner stage for combining the amplified first modulated binary signal, received at a first combiner stage input, and the amplified second modulated binary signal, received at a second signal combiner input, into a amplified stage output radio signal; and
  a power distributor for independently switching on and off a first power supply for the first amplifier module and a second power supply for the second independent amplifier module depending on a desired output power.

2. The amplifier arrangement according to claim 1, further comprising at least a first filter for filtering the amplified first modulated binary signal.

3. A method for amplifying a radio signal in a mobile communication network comprising:
- splitting an amplifier input radio signal into at least a radio signal portion, and at least a second radio signal portion;
- converting the first radio signal portion to a first modulated binary signal by a first delta-sigma modulator;
- amplifying the first modulated binary signal by at least a first amplifier module;
- converting the second radio signal portion to a second modulated binary signal by a second delta-sigma modulator;
- amplifying the second modulated signal binary by at least an independent second amplifier module; and
- combining the amplified first modulated signal binary and the amplified second modulated signal binary into an amplified stage output radio signal,
- wherein the method comprises independently switching on or off a first power supply for the first amplifier module and a second power supply for the second independent amplifier module depending on a desired output power.

4. The amplifier arrangement according to claim 1, wherein the first filter is a film bulk acoustic resonator filter.

5. The method of claim 3, further comprising filtering the amplified first modulated binary signal.

* * * * *

UNITED STATES PATENT AND TRADEMARK OFFICE
CERTIFICATE OF CORRECTION

| | |
|---|---|
| PATENT NO. | : 9,166,537 B2 |
| APPLICATION NO. | : 13/887648 |
| DATED | : October 20, 2015 |
| INVENTOR(S) | : Lothar Schmidt |

It is certified that error appears in the above-identified patent and that said Letters Patent is hereby corrected as shown below:

Claim 1, Column 12, line 45, "into at least a first signal" should be -- into at least a first radio signal --

Claim 3, Column 13, line 6, "into at least a radio" should be -- into at least a first radio --

Signed and Sealed this
Sixteenth Day of February, 2016

Michelle K. Lee
*Director of the United States Patent and Trademark Office*